INVENTORS
*Alfred Nazareth, Jr.*
*Walter I. Cook*
BY
*Curtis Morris & Safford*
ATTORNEYS May 2, 1967 A. NAZARETH, JR., ET AL 3,317,758

DRIFT-FREE D.C.-TO-A.C. CONVERTER EMPLOYING BALANCED LOOPS IN COMBINATION WITH SYMMETRICAL FIELD EFFECT TRANSISTOR

Filed May 3, 1965 2 Sheets-Sheet 2

United States Patent Office 3,317,758
Patented May 2, 1967

3,317,758

DRIFT-FREE D.C.-TO-A.C. CONVERTER EMPLOYING BALANCED LOOPS IN COMBINATION WITH SYMMETRICAL FIELD EFFECT TRANSISTOR

Alfred Nazareth, Jr., Rehoboth, and Walter I. Cook, Marblehead, Mass., assignors to The Foxboro Company, Foxboro, Mass.

Filed May 3, 1965, Ser. No. 452,618
8 Claims. (Cl. 307—88.5)

Figure 1:
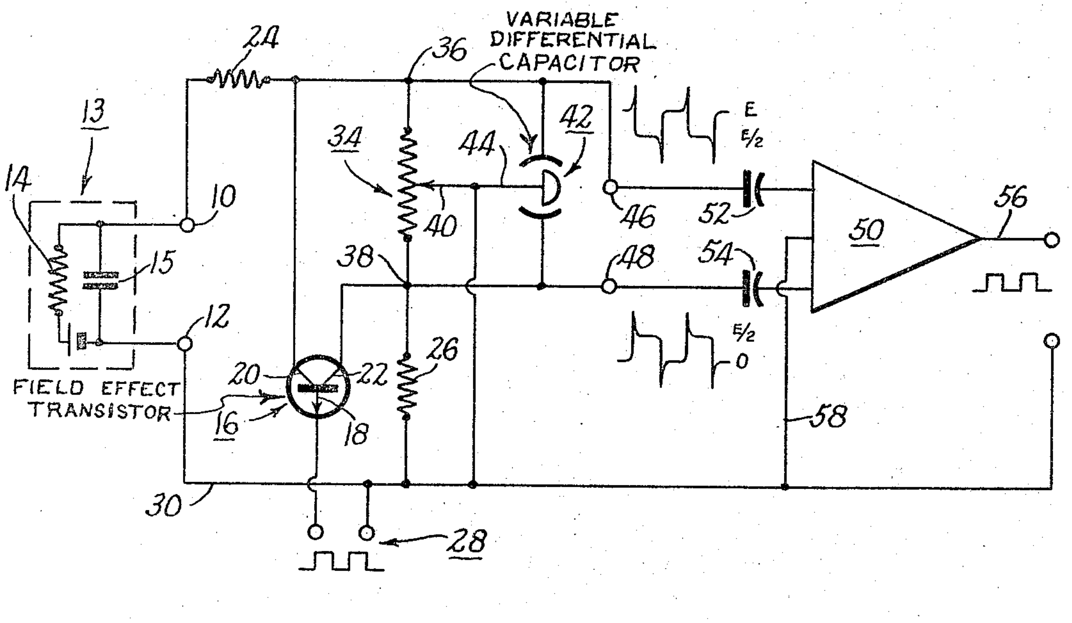

This invention relates to electric signal translation circuits. More particularly, this invention relates to an improved solid-state converter circuit for translating a low amplitude D.-C. signal into an alternating signal the amplitude of which is proportional to the input signal.

Various types of converter circuits are, of course, known to the art for translating a D.-C. signal into a "chopped" or periodically undulating output signal having an amplitude proportional to the input signal. In general, the reason for this conversion is the greater facility of amplification and further processing of the A.-C. signal in comparison with amplification and processing of a D.-C. signal.

Mechanical converters or choppers have been utilized but, in many applications, it is desirable to avoid devices using moving mechanical parts in order to ensure long term reliability. Other devices or circuits with offset voltages, junction or contact potentials, or mechanisms or circuits that require the matching of parameters have generally been unsatisfactory because their characteristics shift with time or environmental conditions such as temperature.

Accordingly, it is an object of this invention to provide an improved D.-C. to A.-C. converter circuit. It is a more specific object of this invention to provide such a converter circuit wherein the output is substantially drift-free, particularly in the face of changes in ambient temperature.

In the disclosed embodiments of this invention, there are provided converter circuits utilizing field effect transistors. In general, the field effect transistor is a majority carrier, unipolar semi-conductor device having source, drain and gate electrodes in which the source-drain conductance is controlled by the gate voltage, and introduces no offset voltage. When the gate is biased to pinch-off, the field effect transistor provides a maximum value of resistance between the source and drain terminals.

Generally, the field effect transistor is connected as a variable resistance element in a circuit and the D.-C. signal to be converted is coupled across the circuit. The impedance of the field effect transistor is periodically driven from relatively low to relatively high, for example by a square wave applied to the gate electrode. As the resistance of the transistor changes from minimum to maximum, the voltage developed thereacross will similarly change to provide a periodically varying output voltage the amplitude of which is proportional to the input voltage. Circuit means are provided to derive the periodically varying signal as an output signal for further processing.

The circuit includes drain-to-gate and source-to-gate return loops which are balanced to cancel the effects of offset voltages due to gate-to-source and gate-to-drain leakage currents. Additionally, the balancing loops may include bridge networks arranged to aid in cancelling the feedthrough of the gate driving voltage via the gate-drain and gate-source junction capacities.

When so balanced, the converter output will be substantially independent of temperature since the symmetrical characteristics of the transistor will tend to produce equal variations in the return loops with changes in temperature.

Dependent upon the application intended, the circuitry may be utilized as a series or shunt chopper. In either configuration, the selection of a symmetrical field effect transistor coupled with the provision of balanced loops from gate-to-source and gate-to-drain provides a solid state "chopper" of improved drift, offset voltage, overshoot and cost factors. In some applications, it may be found desirable to include means for adjusting the return loop resistance and capacitance to compensate for minor transistor asymmetry.

Figure 2A:
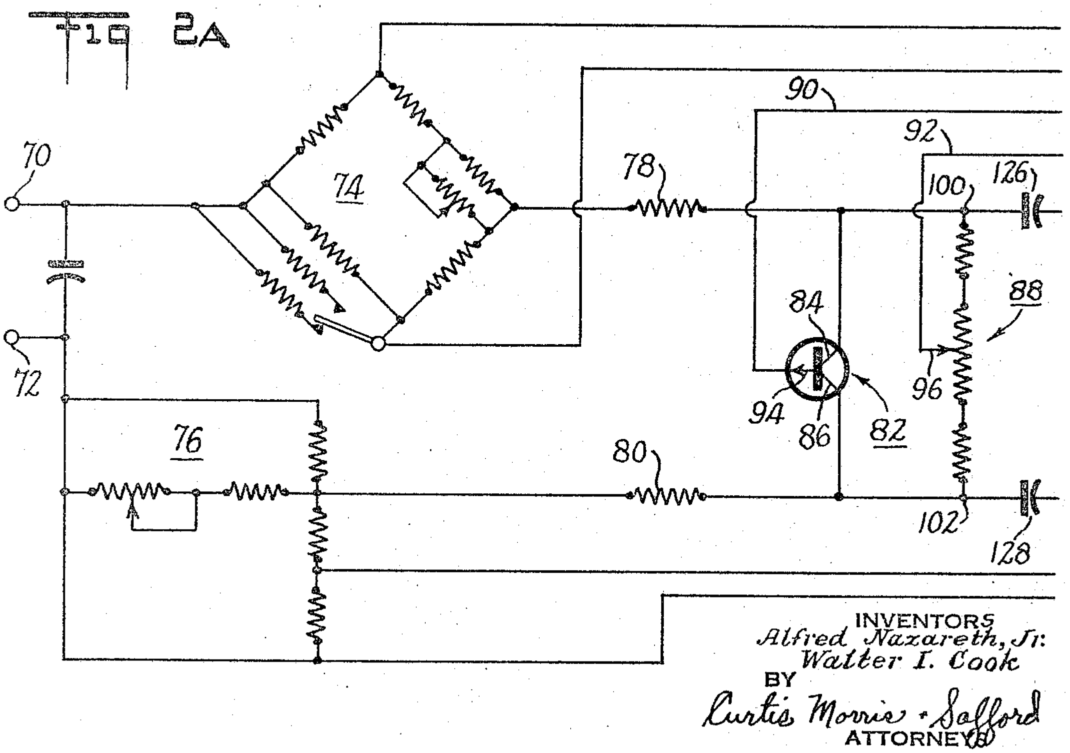

Having briefly described this invention, it will be described in greater detail along with other objects, aspects and advantages in the following specification considered together with the accompanying drawings, in which:

FIGURE 1 is a schematic diagram of a converter circuit in accordance with the present invention; and FIGURES 2*a* and *b* show a schematic diagram of an instrument employing another converter circuit in accordance with the present invention.

In FIGURE 1, there is shown a converter circuit for chopping a D.-C. signal applied to input terminals 10 and 12 from a source 13 having internal resistance 14 and capacitance 15. The input signal is a voltage of low magnitude which may, for example, be a direct voltage ranging to 100 microvolts. The circuit employs a field effect transistor 16 having gate, source and drain electrodes 18, 20 and 22 respectively. Resistors 24 and 26 are serially coupled with the field effect transistor by connection of said resistors respectively to the source and drain electrodes. The input voltage is coupled across the loop formed by the transistor 16 and resistors 24 and 26. A square-wave drive source 28 is applied between the reference line 30 (tied to input terminal 12) and the gate electrode 18 to alternately drive the transistor 16 between the minimum resistance state and the maximum resistance state (pinch-off).

To review, the field effect transistor is a variable resistance device, and the square-wave biasing of its gate electrode swings the transistor resistance between maximum and minimum. Thus, the unidirectional voltage applied to terminals 10 and 12 is chopped by the changing resistance in series with resistor 26 to generate across that resistor a signal of essentially square wave form. The voltage across this resistor will vary between zero and one-half the input voltage, in the form of a periodic square wave. Thus, the amplitude of the signal across resistor 26 is proportional to the input voltage, and its frequency is determined by the frequency of the gate drive voltage. For example, a 1,000 c.p.s. chopping frequency may be employed to provide an output voltage at 1,000 c.p.s. which is adaptable to processing and amplification by conventional circuitry.

By providing equal resistances in the gate-to-source and gate-to-drain return circuit loops, the effect of the gate leakage current is balanced out. Thus, with the resistors 24 and 26 equal, and the impedance of source 13 insignificant in comparison to these resistors, the offsetting effects of gate leakage current flow caused by the driving voltage on the gate will be effectively cancelled. That is, the gate-to-source and gate-to-drain leakage currents will be equal, causing equal gate-to-source and gate-to-drain voltage drops within the transistor, and these internal voltage drops are self-cancelling with respect to the chopper output because they are oppositely-polarized, i.e. the two leakage currents flow in opposite directions with respect to the output terminals.

Field effect transistors now produced commercially are generally symmetrical in construction and have balanced gate-to-source and gate-to-drain resistance. Nevertheless, provision advantageously may be made in some cases for compensating for slight asymmetry of the transistor leakage resistances by means of potentiometer 34. Terminals 36 and 38 of potentiometer 34 are coupled respectively to the source and drain electrodes 20 and 22 of the transistor. The movable tap 40 is coupled to the reference line 30, and is adjusted to a balance position providing proper compensation.

Another factor which may be of concern in some applications is overshoot voltages or "spikes" appearing in the output. The spikes are caused by displacement currents fed through the gate-to-source and gate-to-drain junction capacities by the square-wave gate drive voltage, and thus appear at both resistors 24 and 26. To aid in their ultimate cancellation, the spikes at resistors 24 and 26 are made of equal amplitude by suitable adjustment of a variable differential capacitor 42 coupled between source and drain electrodes of the transistor with the common terminal 44 thereof coupled to the movable tap 40 of the potentiometer (and thus to the reference line 30). With this arrangement, there is provided an RC bridge the arms of which are adjustable for balancing.

The voltage of resistor 24 at the connection to transistor 16 varies in square-wave fashion essentially between the full input voltage and one-half that input voltage, while the voltage of resistor 26 similarly varies between zero and one-half the input voltage. Thus, these two voltages are out-of-phase. However, the spikes generated by capacitive coupling at resistors 24 and 26 are in phase. This distinction is utilized to provide means for effectively cancelling the spikes while passing the desired signal through.

In more detail, the pulsed outputs across resistors 24 and 26 are coupled to the output terminals 46 and 48 respectively and applied to a differential amplifier 50 through coupling capacitors 52 and 54 respectively. This amplifier has a single-ended output 56 and its common input terminal is connected to reference line 30 by a lead 58. By adjustment of the tap position of the potentiometer and the differential capacitor, the bridge arms are set to a position providing equal spikes at the two resistors 24 and 26. By connecting these outputs to the differential amplifier, any spikes due to feed through are self-cancelling, leaving only the square-wave signal proportional to the D.-C. input signal. It may be noted that the effectiveness of spike cancellation depends upon the differential amplifier having a relatively high ratio of common mode rejection.

In FIGURES 2*a* and *b*, there is shown a complete instrument for converting the output voltage from a thermocouple into a chopped voltage, amplifying of such chopped voltage, and reconversion thereof into a relatively high-level D.-C. output signal, e.g. a current output signal in the range of 10 to 50 milliamps. Starting with FIG. 2*a*, the input voltage is applied to the input terminals 70, 72. A conventional bridge circuit 74 is connected in series with the input for injection of the elevation voltage for the thermocouple and for instrument zero adjustment. Another circuit 76 provides a negative feedback voltage in series with the input, and is provided with adjustable resistance in order to permit alteration of the instrument "span," i.e. the amount of output change for a given input change.

The net voltage is applied across a circuit formed by the serially-coupled resistors 78, 80 and a field effect transistor 82. Resistors 78 and 80 (1,000 ohms each) are connected to the source and drain electrodes 84 and 86 respectively. A potentiometer arrangement 88 also is coupled across the source and drain electrodes. The gate drive voltage for transistor 82 is applied over leads 90 and 92 between the gate electrode 94 and the tap 96 of potentiometer 88.

The drive voltage is a square-wave signal having a 1 kc. frequency and an amplitude sufficient to drive the transistor 82 alternately from maximum to minimum resistance states. The voltage appearing across the source and drain electrodes, therefore, will be a chopped square wave the amplitude of which is proportional to the input voltage.

The offset voltages resulting from the gate drive voltage are balanced out by providing equal resistance gate-to-drain and gate-to-source return loops. Thus the differential output between terminals 100, 102 is essentially free from such offset voltages, so that the output signal does not drift significantly with changes in temperature. The potentiometer 88 can be adjusted to compensate for any slight asymmetries in the field effect transistor.

Figure 2B:
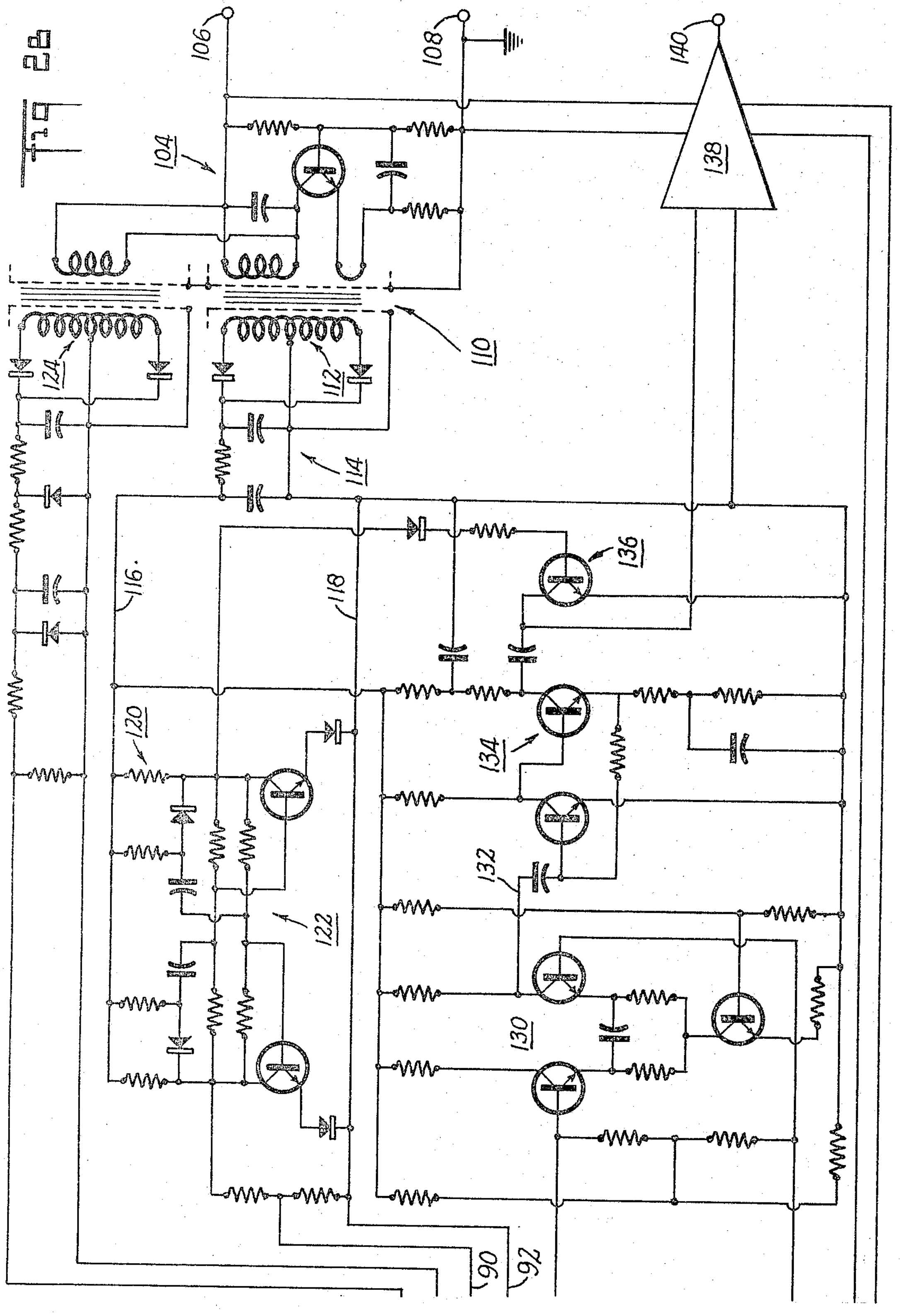

Turning now to FIG. 2*b*, it is seen that the gate drive voltage is provided by an oscillator 104 running at, for example, 25 kc. in a class A arrangement from a supply on terminals 106, 108. The output voltage from the oscillator is coupled to the primary of a transformer 110, and the output from one secondary 112 is rectified and filtered by circuitry 114 to provide a 15 v. D.-C. supply between leads 116 and 118. An astable free-running multivibrator 120 is energized by these leads to generate a square wave at the desired chopper frequency, e.g., 1 kc. to drive the gate of transistor 82. The multivibrator is provided with a bridge network 122 to tie the base voltages midway between the collector voltages to ensure starting of the multivibrator.

The elevation voltage for the thermocouple is a direct voltage derived by rectifying and filtering the A.-C. signal from another secondary 124 of transformer 110.

The output voltage is derived from terminals 100 and 102 which are coupled respectively through capacitors 126, 128 to the input terminals of a differential amplifier 130. Thus, the output voltage on lead 132 is proportional to the difference in potential between terminals 100 and 102 but effectively is not responsive to changes in the absolute voltage of both terminals. The output from the differential amplifier is then further amplified by a direct-coupled A.-C. amplifier 134, demodulated by a phase-sensed detector 136, and applied to a D.-C. amplifier 138. This latter amplifier may be like that shown in U.S. Patent No. 2,956,234 and is provided with two isolated outputs each adapted to produce a D.-C. signal porportional to the input to the amplifier. One output is connected to lead 140 by which the output current can be conducted to control or recording instruments of conventional construction. The other output is fed back to network 76 for span setting.

Although preferred embodiments of the invention have been disclosed in detail, it is desired to emphasize that this is for the purpose of illustrating the invention so that those skilled in the art can make such modifications as may be required to adapt the invention to specific applications, it being understood that the scope of the invention is not thereby restricted except as may be required by the prior art.

We claim:

1. A converter for translating a D.-C. signal into an alternating signal having an amplitude proportional to the magnitude of said D.-C. signal, comprising a field effect transistor having gate, source, and drain electrodes, a source of alternating drive signals coupled to said gate electrode to drive said transistor between small and large impedance states repeatedly, a signal processing circuit loop including the source-drain path through said transistor, means for applying said D.-C. signal across said signal processing loop, means for deriving from said signal processing loop an alternating output signal responsive to the magnitude of said D.-C. signal, and circuit means coupling said gate electrode to said source and drain electrodes to provide equal impedance gate-to-source and gate-to-drain loops to balance offset voltages induced by said gate drive voltage.

2. A converter in accordance with claim 1 in which said signal processing circuit loop comprises a first resistor and a load resistor, said first resistor and said load resistor being serially coupled respectively to the source and drain electrodes of said field effect transistor, the resistance of said first resistor and said load resistor being substantially equal, and in which said means for deriving an output signal comprises circuit means coupled across said load resistor.

3. A converter in accordance with claim 1 in which said signal processing circuit loop comprises a first resistor and a load resistor serially coupled with the source and drain electrodes of said transistor across said input signal, and which includes a potentiometer having end terminals and a variably positioned tap electrode, means coupling said potentiometer across said transistor with said end electrodes coupled to said gate and drain electrodes respectively, and means including said gate drive source for coupling said tap electrode of said potentiometer to said gate electrode.

4. A converter in accordance with claim 1 in which said signal processing circuit loop comprises a first resistor and a load resistor serially coupled respectively to said source and drain electrodes of said transistor, a variable differential capacitor having a center tap and end terminals, means coupling said differential capacitor across said transistor with said end terminals coupled to said source and said drain electrodes respectively, and means including said gate drive source for coupling said center tap to said gate electrode.

5. A converter in accordance with claim 3 which includes a variable differential capacitor having end terminals and a center tap, means for coupling said capacitor across said potentiometer with the end terminals of said capacitor coupled respectively to the end terminals of said potentiometer, and means for coupling said center tap of said differential capacitor to said tap electrode of said potentiometer.

6. A converter in accordance with claim 5 in which the means for deriving an output signal comprises circuit means coupled across said potentiometer and means to derive a signal responsive to the differential voltage appearing across the end terminals of said potentiometer.

7. A converter in accordance with claim 1 in which said signal processing circuit loop comprises a first resistor serially coupled with said transistor and in which said means for deriving an output signal comprises circuit means for deriving the signal generated between said source and drain electrodes of said transistor and which includes a potentiometer having end terminals and a variably positioned tap electrode, means for coupling said potentiometer across said transistor by coupling an end terminal respectively to said source and said drain electrodes, and means coupling said gate drive signal between said gate electrode and said tap electrode.

8. A converter in accordance with claim 7 in which said means for deriving a signal includes isolating capacitors coupled respectively to said source and said drain electrodes and which includes signal processing means responsive to the differential voltage between said source and said drain electrodes to generate an output signal.

No references cited.

ARTHUR GAUSS, *Primary Examiner.*

J. S. HEYMAN, *Assistant Examiner.*